(12) United States Patent
Schneiders et al.

(10) Patent No.: US 7,948,609 B2
(45) Date of Patent: May 24, 2011

(54) LITHOGRAPHIC APPARATUS, STAGE SYSTEM AND STAGE CONTROL METHOD

(75) Inventors: Mauritius Gerardus Elisabeth Schneiders, Eindhoven (NL); Wilhelmus Franciscus Johannes Simons, Beesel (NL)

(73) Assignee: ASML Netherlands B.V., Veldhoven (NL)

(*) Notice: Subject to any disclaimer, the term of this patent is extended or adjusted under 35 U.S.C. 154(b) by 225 days.

(21) Appl. No.: 12/337,053

(22) Filed: Dec. 17, 2008

(65) Prior Publication Data

US 2009/0231566 A1    Sep. 17, 2009

Related U.S. Application Data

(60) Provisional application No. 61/008,145, filed on Dec. 19, 2007.

(51) Int. Cl.
*G03B 27/58* (2006.01)
*G03B 27/62* (2006.01)

(52) U.S. Cl. .......................... 355/72; 355/75

(58) Field of Classification Search .................. 355/53, 355/72–76; 700/45, 121; 310/10, 12; 318/649
See application file for complete search history.

(56) References Cited

U.S. PATENT DOCUMENTS

| | | |
|---|---|---|
| 7,084,958 B2 | 8/2006 | Butler |
| 7,113,256 B2 * | 9/2006 | Butler et al. ........... 355/53 |
| 7,209,219 B2 * | 4/2007 | Butler ................... 355/75 |
| 2005/0231699 A1 | 10/2005 | Butler |
| 2007/0258079 A1 * | 11/2007 | Kamidi et al. ........ 355/72 |

FOREIGN PATENT DOCUMENTS

| | | |
|---|---|---|
| EP | 1 566 696 A1 | 8/2005 |
| KR | 10-0598635 B | 7/2006 |
| KR | 10-0714468 B | 5/2007 |

OTHER PUBLICATIONS

Korean Office Action directed to related Korean Application No. KR 10-2008-0127807, mailed Dec. 9, 2010 from the Korean Intellectual Property Office; 4 pages.

* cited by examiner

*Primary Examiner* — Hung Henry Nguyen
(74) *Attorney, Agent, or Firm* — Sterne, Kessler, Goldstein & Fox P.L.L.C.

(57) ABSTRACT

In an embodiment, a lithographic apparatus includes a stage system including a movable stage, and a stage control system to control a position of the stage in response to a setpoint signal. The stage control system includes a feedback control loop to control the position in a feedback manner, the feedback control loop having a setpoint input, and an acceleration feedforward to generate a feedforward signal to be forwardly fed into the feedback control loop. The feedforward signal is derived from the setpoint signal. The stage control system is arranged to modify the position setpoint signal into a modified position setpoint signal, the setpoint input of the feedback control loop to receive the modified position setpoint signal, the modified position setpoint signal to take account of a non rigid body behavior of the stage.

12 Claims, 4 Drawing Sheets

LITHOGRAPHIC APPARATUS, STAGE SYSTEM AND STAGE CONTROL METHOD

CROSS-REFERENCE TO RELATED APPLICATIONS

The present application claims the benefit of U.S. Provisional Patent Appl. No. 61/008,145, filed Dec. 19, 2007, which is incorporated by reference herein in its entirety.

BACKGROUND

1. Field

Embodiments of the present invention relate to a lithographic apparatus, a stage system and a stage control method.

2. Background

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, use is made of control systems to control a position, velocity, acceleration and/or other position parameters of a movable part, such as a substrate stage (also referred to as substrate table or wafer table) or a support (also referred to as mask table or mask stage). In such control systems, use is made of a feedback control loop to provide an accurate response of the control system. In addition, to achieve a fast response, use may be made of a feedforward, such as acceleration feedforward. Such acceleration feedforward may provide a desired force to move the stage or other movable parts in question, the acceleration feedforward being determined by multiplying the desired acceleration with a mass of the stage or other movable parts. However, the stage may not be infinitely stiff, i.e. is not a rigid body, and internal resonance modes, such as flex modes, may react to the feedforward, thereby possibly resulting in a deformation of the stage during acceleration or deceleration.

In the feedback loop, a position measurement is provided to determine a position of the stage. The position measurement however does not take place at a same location point of the stage as the location point where the actuator force is applied, which as a consequence results in a position error when the above deformation of the stage occurs. To be able to cancel such error, an additional force may be applied, using a snap-feedforward, which (almost) instantaneously provides for a movement of the stage. The snap-feedforward may in a control diagram representation be provided as an additional feedforward path parallel to the acceleration feedforward, and being inputted with a corresponding setpoint signal. In this document, the term snap is to be understood as a double time derivative of the acceleration. By application of the snap-feedforward, the point at the stage where the position is measured thereby more precisely corresponds to the desired position setpoint. The deformation has however not been cancelled by this snap-feedforward. In the deceleration phase, an opposite effect may take place, whereby the deformation may be directed in an opposite direction.

Thus, despite application of the snap-feedforward, deformation of the stage may take place in dynamic situations, and the instantaneous movements of the stage by application of the snap-feedforward may add high frequency components to the movement of the stage, and may create a residual error when the snap-feedforward is applied.

SUMMARY

To improve a dynamic behavior of the stage, according to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a stage control system to control a position of one of the support and the substrate table in response to a setpoint signal. The stage control system includes a feedback control loop to control the position in a feedback manner, the feedback control loop having a setpoint input, and an acceleration feedforward to generate a feedforward signal to be forwardly fed into the feedback control loop. The feedforward signal is derived from the setpoint signal. The stage control system is arranged to modify the position setpoint signal into a modified position setpoint signal, the setpoint input of the feedback control loop to receive the modified position setpoint signal, the modified position setpoint signal to take account of a non rigid body behavior of the one of the substrate table and the support.

In another embodiment of the invention, there is provided a stage system for a lithographic apparatus, including a movable stage and a stage control system to control a position of the stage in response to a setpoint signal. The stage control system includes: a feedback control loop to control the position in a feedback manner, the feedback control loop having a setpoint input, and an acceleration feedforward to generate a feedforward signal to be forwardly fed into the feedback control loop. The feedforward signal is derived from the setpoint signal. The stage control system is arranged to modify the position setpoint signal into a modified position setpoint signal, the setpoint input of the feedback control loop to receive the modified position setpoint signal, the modified position setpoint signal to take account of a non rigid body behavior of the stage.

According to a further embodiment of the invention, there is provided a lithographic apparatus stage control method to control a position of a movable stage in response to a setpoint signal, including: controlling the stage position in a feedback manner, by a feedback control loop having a setpoint input; and generating a feedforward signal to be forwardly fed into the feedback control loop. The feedforward signal is derived from the setpoint signal. The position setpoint signal is modified into a modified position setpoint signal, the setpoint input of the feedback control loop to receive the modified position setpoint signal, the modified position setpoint signal to take account of a non rigid body behavior of the stage.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
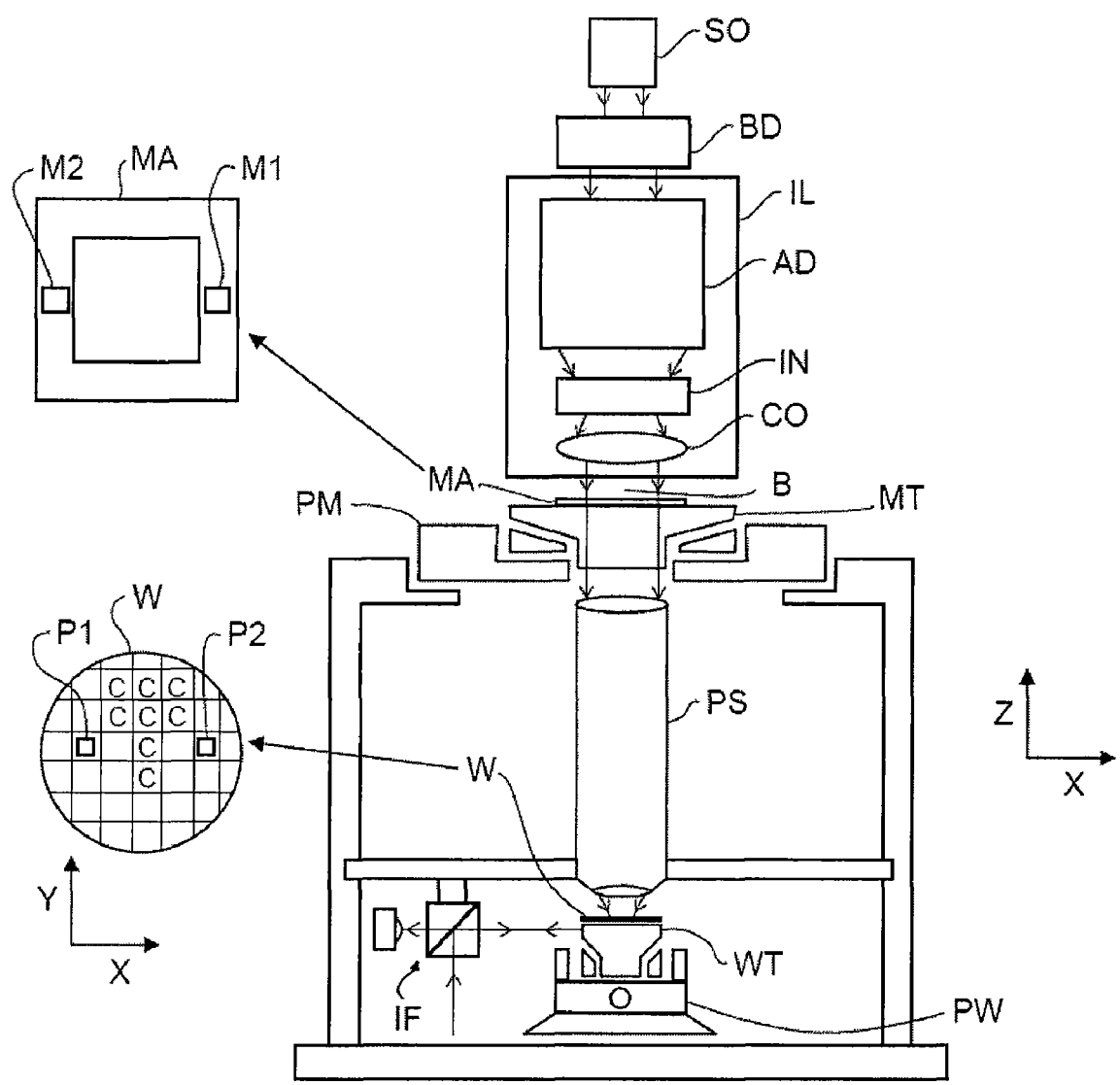
FIG. 1 depicts a lithographic apparatus in which an embodiment of the invention may be provided.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure holds the patterning device in a manner that depends on the orientation of the patterning device, the design of the lithographic apparatus, and other conditions, such as for example whether or not the patterning device is held in a vacuum environment. The patterning device support or support structure can use mechanical, vacuum, electrostatic or other clamping techniques to hold the patterning device. The patterning device support or support structure may be a frame or a table, for example, which may be fixed or movable as required. The patterning device support or support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask) MA, which is held on patterning device support or support structure (e.g., mask table) MT, and is patterned by the patterning device. Having traversed patterning device (e.g. mask) MA, radiation beam B passes through projection system PS, which focuses the beam onto a target portion C of substrate W. With the aid of second positioning device PW and position sensor IF (e.g. an interferometric device, linear encoder or capacitive sensor), substrate table WT can be moved accurately, e.g. so as to position different target portions C in the path of radiation beam B. Similarly, first positioning device PM and another position sensor (which is not explicitly depicted in FIG. 1) can be used to accurately position patterning device (e.g. mask) MA with respect to the path of radiation beam B, e.g. after mechanical retrieval from a mask library, or during a scan. In general, movement of patterning device support (e.g. mask table) MT may be realized with the aid of a long-stroke module (coarse positioning) and a short-stroke module (fine positioning), which form part of first positioning device PM. Similarly, movement of substrate table WT or "substrate support" may be realized using a long-stroke module and a short-stroke module, which form part of second positioner PW. In the case of a stepper (as opposed to a scanner), patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on patterning device (e.g. mask) MA, the mask alignment marks may be located between the dies.

The depicted apparatus could be used in at least one of the following modes:

1. In step mode, patterning device support (e.g. mask table) MT or "mask support" and substrate table WT or "substrate support" are kept essentially stationary, while an entire pattern imparted to the radiation beam is projected onto a target portion C at one time (i.e. a single static exposure). Substrate table WT or "substrate support" is then shifted in the X and/or Y direction so that a different target portion C can be exposed. In step mode, the maximum size of the exposure field limits the size of the target portion C imaged in a single static exposure.

2. In scan mode, patterning device support (e.g. mask table) MT or "mask support" and substrate table WT or "substrate support" are scanned synchronously while a pattern imparted to the radiation beam is projected onto a target portion C (i.e. a single dynamic exposure). The velocity and direction of substrate table WT or "substrate support" relative to patterning device support (e.g. mask table) MT or "mask support" may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, patterning device support (e.g. mask table) MT or "mask support" is kept essentially stationary holding a programmable patterning device, and substrate table WT or "substrate support" is moved or scanned while a pattern imparted to the radiation beam is projected onto a target portion C. In this mode, generally a pulsed radiation source is employed and the programmable patterning device is updated as required after each movement of substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
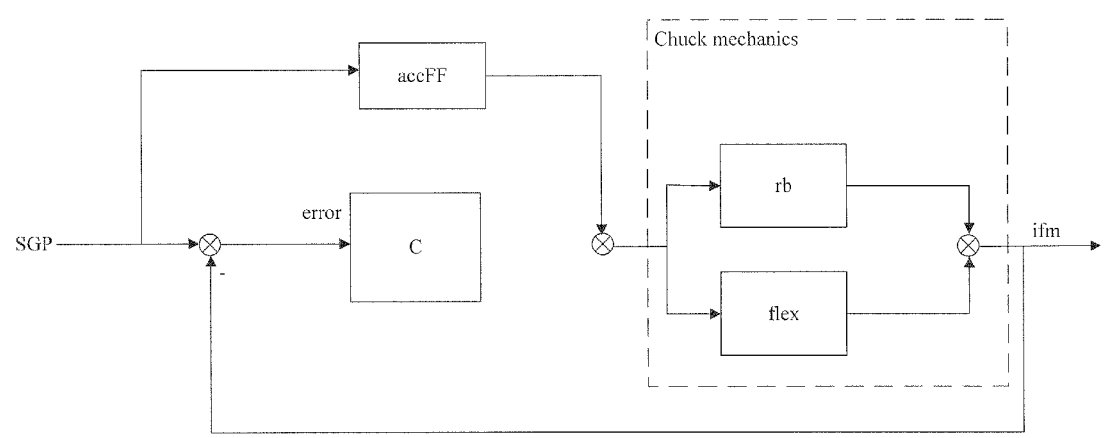
FIG. 2 depicts a schematic representation of a conventional feedback-feedforward control system.

FIG. 2 depicts a feedforward-feedback control system of a stage ST. Stage ST may be configured to control a position of the patterning device support or the substrate support. In the control diagram shown in FIG. 2, stage ST is represented by a rigid body rb transfer function which models a rigid body behavior of the stage, and a flexible body transfer function, indicated in FIG. 2 as flx, which models a flexible (non-rigid) body behavior of the stage. An output, i.e. position parameter of the stage, is measured by ifm, which may be considered an interferometer output, encoder output or any other position parameter related output. A setpoint generator SGP provides a setpoint to the control system. A difference between the setpoint and the position measurement ifm is provided as an error signal to a controller C of the feedback loop, which in turn provides an actuator drive signal to the stage. An acceleration feedforward signal AccFF provides for an additional actuator drive signal of the stage actuator(s), the acceleration feedforward signal being determined from the setpoint, e.g. by twice differentiating a position setpoint and multiplying it by a mass of the stage to obtain a force signal, and determining an actuator drive signal from the force signal.

The above described snap-feedforward may be formed by an additional feedforward substantially parallel to the acceleration feedforward in FIG. 2, and being provided with a suitable input. As an example, the position setpoint may be supplied as input to the snap feedforward and differentiated correspondingly.

Figure 3:
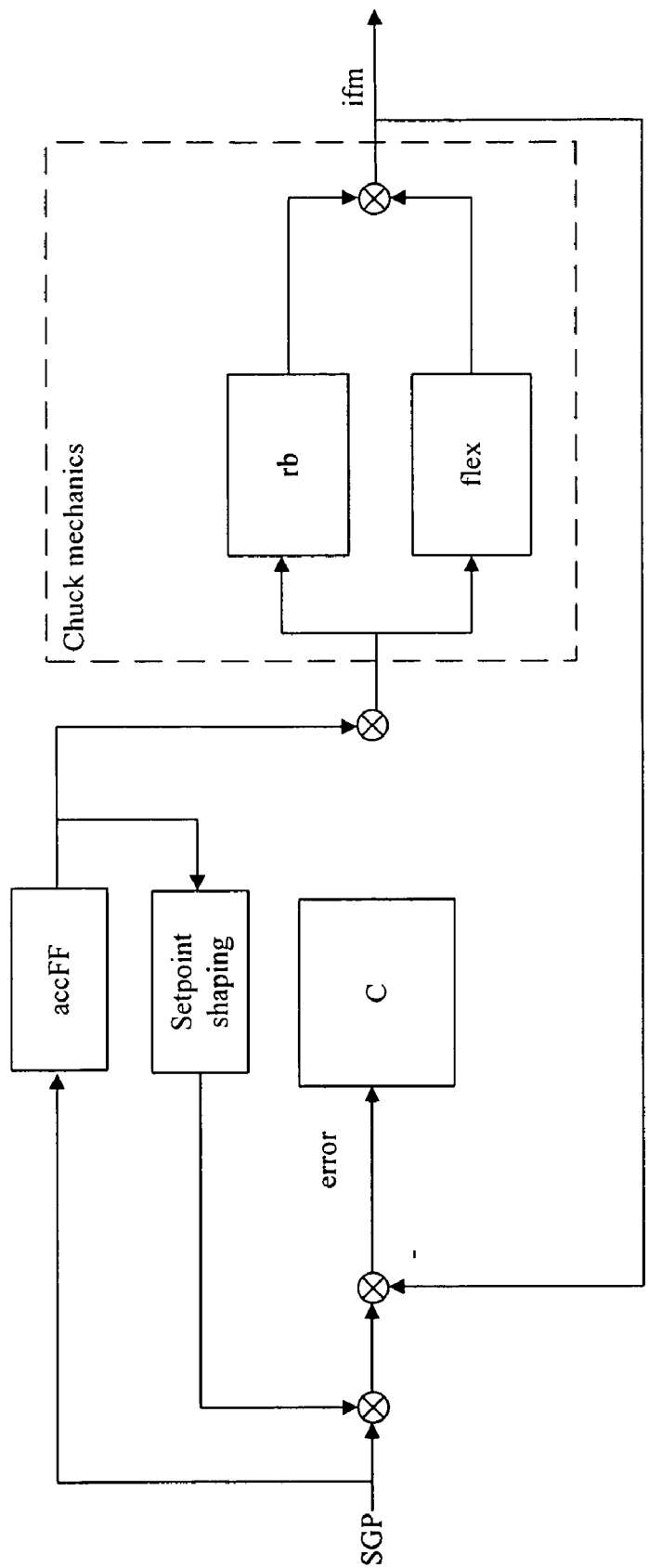
FIG. 3 depicts a schematic representation of a control system according to an embodiment of the invention.

FIG. 3 shows a block schematic control diagram of a control system of a stage according to an embodiment of the invention. The setpoint generator, controller, stage, position sensor output signal ifm, and acceleration feedforward AccFF, may have a same functioning as described above with reference to FIG. 2.

According to an embodiment of the invention, the position setpoint signal is modified and the modified position setpoint signal is provided to the feedback control loop including the controller C. The modified position setpoint signal takes into account a non rigid body behavior of the stage. The setpoint to be provided to the feedback control loop now has been adapted to take into account the flexibility of the stage, which avoids fast transients in the control error, and thus high frequency components in the controlling of the stage and in the stage actuation. The correction of a setpoint signal to modify the setpoint signal into the modified setpoint signal may substantially equal the deformation of the stage caused by the initial feedforward of the acceleration feedforward. Such correction may, in an embodiment, be determined so as to substantially correspond to the feedforward signal as provided by the acceleration feedforward, multiplied by a setpoint shaping function, to thereby generate a setpoint shaping signal. The setpoint shaping signal is then added to the setpoint as provided by the setpoint generator SGP, a result of the addition being provided as a setpoint signal to the closed loop control loop. In the embodiment where the modified setpoint signal is generated by adding a setpoint shaping signal to the setpoint signal, no modification of the setpoint itself is performed, which provides compatibility with existing setpoint profiles and with customer designed setpoint profiles, and avoids the programmer of the setpoint having to take account of the principles described here. According to an embodiment, by determining the setpoint shaping signal from the feedforward signal, it is provided that the setpoint shaping takes place at instances where a dynamic behavior of the stage occurs, i.e. at the instances where the acceleration feedforward is active, thereby providing for a convenient and low processing power requiring solution to modify the setpoint signal. In a further embodiment, the setpoint shaping function may be determined by observing an error of the positioning of the stage. The acceleration feedforward signal times the flexible, i.e. the non rigid, body behavior of the stage may be considered to be causing this error. Knowing the acceleration feedforward, the flexible part of the stage transfer function and the occurring error, the skilled person can now determine a transfer function for the setpoint shaping so as to substantially reduce the remaining error. In case that a resonance frequency of the stage is substantially higher than a harmonic content of the setpoint as provided by the setpoint generator, the setpoint shaping function may be approximated by a constant, which provides for a fast and low processing power requiring determination of the setpoint shaping function.

In general, by modifying the setpoint, a resonance behavior of the stage may be coped with by avoiding excitation of this behavior by modifying a setpoint provided to the feedback control loop. According to the state of the art, the acceleration feedforward is determined from a twice derivative of the position setpoint, thereby forming an acceleration setpoint. Such a twice derivative implicitly assumes that the stage is formed by a rigid body. According to an embodiment of the invention, however, the non ideal behavior of the stage is taken into account, which translates into a different relationship between the setpoint for the position feedback control loop and the acceleration feedforward. According to an embodiment, this is accomplished by modifying the position setpoint signal to take account of the non rigid body behavior of the stage.

The control system described in reference to FIG. 3 may be applied to any control system of the lithographic apparatus, in particular to a stage position control system, such as a patterning device stage control system, substrate table control system, reticle mask position control system, immersion liquid supply system position control system, etc.

The control systems depicted in FIGS. 2 and 3 may be formed by any suitable control system, such as an analog control system, hardware implemented digital control system, software implement digital control system or any other suitable implementation.

Figure 4:
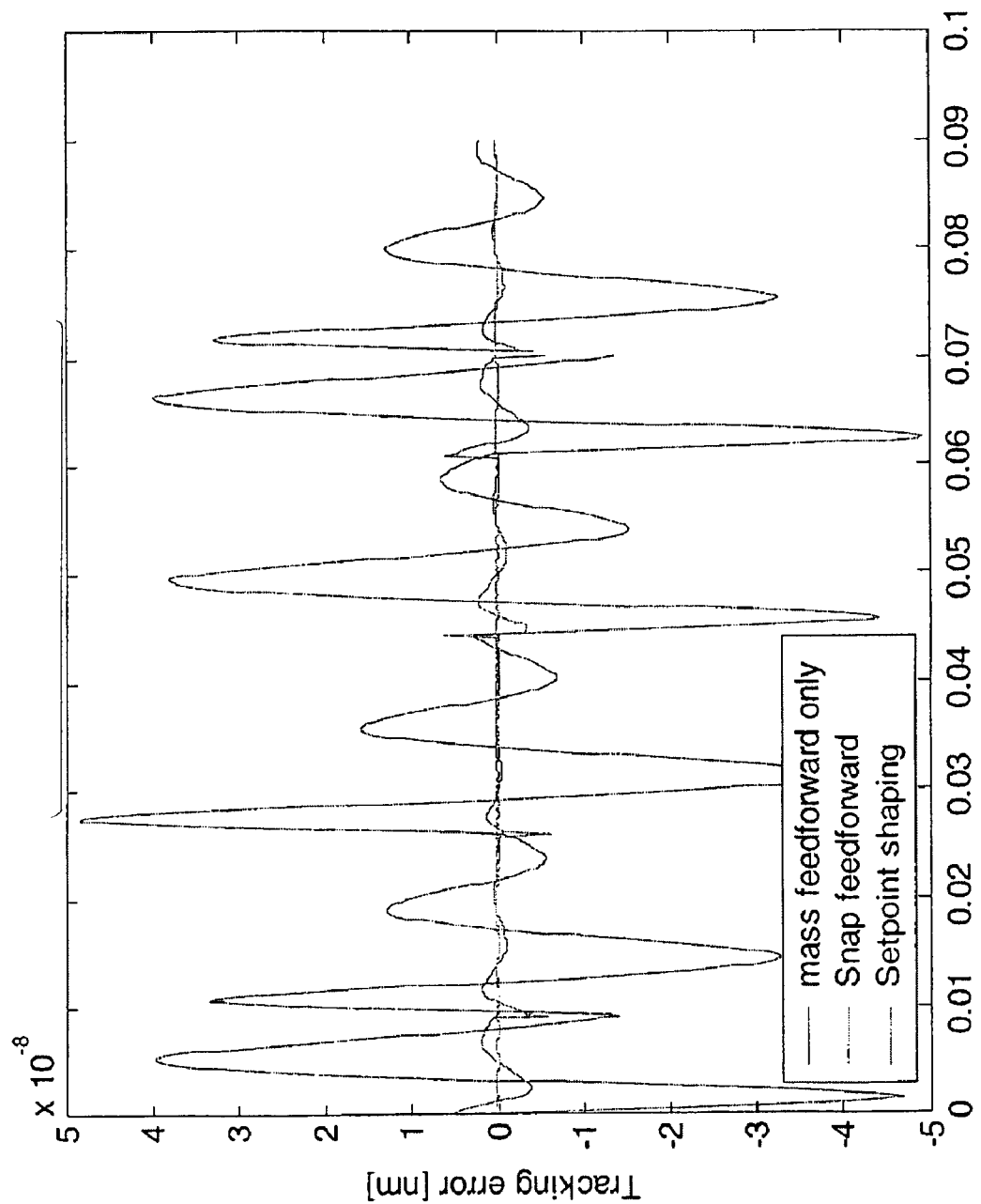
FIG. 4 depicts a tracking error versus time of a stage positioning according to an embodiment of the invention and according to the state of the art.

FIG. 4 depicts a remaining error of the position control systems described above, a tracking error being depicted versus time, the tracking error being defined as a difference between a desired position according to the setpoint generated by the setpoint generator SGP, and a position of the stage as provided by the position measurement signal ifm. As depicted in FIG. 4, snap-feedforward (indicated by 2) reduces the tracking error with respect to mass feedforward (indicated by 1) by a factor of approximately 10. A substantial further reduction is however obtained by the introduction of setpoint shaping (indicated by 3) as described above. In particular, it is to be noted that the excitation of resonant modes of the stage is avoided, which translates in to a low content of resonance behavior in the tracking error.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a stage control system configured to control a position of one of the supports in response to a position setpoint signal, the stage control system comprising:
   a feedback control loop configured to control the position in a feedback manner, the feedback control loop having a setpoint input, and
   an acceleration feedforward configured to generate a feedforward signal to be forwardly fed into the feedback control loop, the feedforward signal derived from the position setpoint signal,
   wherein the stage control system is configured to modify the position setpoint signal into a modified position setpoint signal, the setpoint input of the feedback control loop to receive the modified position setpoint signal, the modified position setpoint signal to take into account a non rigid body behavior of the one of the supports.

2. The lithographic apparatus according to claim 1, wherein the stage control system is configured to generate the modified setpoint signal by adding a setpoint shaping signal to the position setpoint signal.

3. The lithographic apparatus according to claim 2, wherein the stage control system is configured to determine the setpoint shaping signal by multiplying the feedforward signal with a setpoint shaping function.

4. The lithographic apparatus according to claim 3, wherein the setpoint shaping function is selected so as to compensate for a positioning error of the one of the supports, the positioning error substantially equal to the feedforward signal times a transfer function part of the one of the supports, the transfer function part to model the non rigid body behavior of the one of the supports.

5. A stage system for a lithographic apparatus, comprising:
   a movable stage; and
   a stage control system configured to control a position of the stage in response to a position setpoint signal, the stage control system comprising:
   a feedback control loop configured to control the position in a feedback manner, the feedback control loop having a setpoint input; and
   an acceleration feedforward configured to generate a feedforward signal to be forwardly fed into the feedback control loop, the feedforward signal derived from the position setpoint signal,
   wherein the stage control system is configured to modify the position setpoint signal into a modified position setpoint signal, the setpoint input of the feedback control loop to receive the modified position setpoint signal, the modified position setpoint signal to take into account a non rigid body behavior of the stage.

6. The stage system according to claim 5, wherein the stage control system is configured to generate the modified setpoint signal by adding a setpoint shaping signal to the position setpoint signal.

7. The stage system according to claim 6, wherein the stage control system is configured to determine the setpoint shaping signal by multiplying the feedforward signal with a setpoint shaping function.

8. The stage system according to claim 7, wherein the setpoint shaping function is selected so as to compensate for a positioning error of the stage, the positioning error substantially equal to the feedforward signal times a transfer function part of the stage, the transfer function part to model the non rigid body behavior of the stage.

9. A lithographic apparatus stage control method to control a position of a movable stage in response to a position setpoint signal, comprising:
   controlling the position of the stage in a feedback manner using a feedback control loop having a setpoint input; and generating a feedforward signal to be forwardly fed into the feedback control loop, the feedforward signal derived from the position setpoint signal, wherein the position setpoint signal is modified into a modified position setpoint signal, the setpoint input of the feedback control loop to receive the modified position setpoint signal, the modified position setpoint signal to take account of a non rigid body behavior of the stage.

10. The lithographic apparatus stage control method according to claim 9, wherein the modified setpoint signal is generated by adding a setpoint shaping signal to the position setpoint signal.

11. The lithographic apparatus stage control method according to claim 10, wherein the setpoint shaping signal is determined by multiplying the feedforward signal with a setpoint shaping function.

12. The lithographic apparatus stage control method according to claim 11, wherein the setpoint shaping function is selected so as to compensate for a positioning error of the stage, the positioning error substantially equal to the feedforward signal times a transfer function part of the stage, the transfer function part to model the non rigid body behavior of the stage.

* * * * *